(12) United States Patent
Lee

(10) Patent No.: US 7,420,854 B2
(45) Date of Patent: Sep. 2, 2008

(54) SRAM DEVICE AND OPERATING METHOD

(75) Inventor: Cheng Hung Lee, Hukou (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 271 days.

(21) Appl. No.: 11/493,345

(22) Filed: Jul. 26, 2006

(65) Prior Publication Data

US 2008/0025109 A1     Jan. 31, 2008

(51) Int. Cl.
*G11C 7/10* (2006.01)

(52) U.S. Cl. .................. 365/189.05; 365/154

(58) Field of Classification Search ............ 365/189.05, 365/154
See application file for complete search history.

(56) References Cited

U.S. PATENT DOCUMENTS

| | | | |
|---|---|---|---|
| 6,442,060 B1* | 8/2002 | Leung et al. | 365/154 |
| 2005/0047196 A1* | 3/2005 | Bhavnagarwala et al. | 365/154 |
| 2005/0157537 A1* | 7/2005 | Wei et al. | 365/154 |

* cited by examiner

*Primary Examiner*—Anh Phung
*Assistant Examiner*—Toan Le
(74) *Attorney, Agent, or Firm*—K & L Gates LLP

(57) ABSTRACT

An improved SRAM cell and its operating method are disclosed. The SRAM cell comprises at least four original transistors, e.g., a pair of pass-gate transistors and a pair of pull-up transistors. The SRAM cell also comprises a pair of parasitic transistors formed by making contacts to a Pwell underneath a buried insulation layer to make the Pwell a gate terminal; hence the buried insulation layer serves as a gate insulation for the parasitic transistor.

27 Claims, 6 Drawing Sheets

SRAM DEVICE AND OPERATING METHOD

BACKGROUND

The present invention relates generally to semiconductor memory devices, and, more particularly, to static random access memory cells.

It is a continuing effort to make semiconductor integrated circuit memory devices ever smaller to consume even lower power. Semiconductor memory devices include, for example, static random access memory, or SRAM, and dynamic random access memory, or DRAM. DRAM memory cells have only one transistor and one capacitor, so they provide a high degree of integration. But DRAM requires constant refreshing, its power consumption and slow speed limit its use to mainly computer main memories. SRAM cell, on the other hand, is bi-stable, meaning it can maintain its state indefinitely as long as adequate power is supplied. SRAM can operate at higher speeds and lower power dissipation, so computer cache memories use exclusively SRAMs. Other applications include embedded memories and networking equipment memories.

One well-known conventional structure of a SRAM cell is a six transistor (6T) cell that comprises six MOS transistors. Briefly, a 6T SRAM cell comprises two cross-coupled inverters that form a latch circuit, i.e., one inverter's output connected to the other inverter's input. The latch circuit is connected between power and ground. Each inverter comprises a NMOS pull-down transistor and a PMOS pull-up transistor. The inverter's outputs serve as two storage nodes, when one is pulled low, the other is pulled high. A complementary bit-line pair is coupled to the pair of storage nodes via a pair of pass-gate transistors, respectively. The gate terminals of the pass-gate transistors are commonly connected to a word-line. When the word-line voltage is switched to a high voltage system, or Vcc, the pass-gate transistors are turned on to allow the storage nodes to be accessible by the bit-line pair. When the word-line voltage is switched to a system low voltage, or Vss, the pass-gate transistors are turned off and the storage nodes are essentially isolated from the bit lines, although some leakage can occur. Nevertheless, as long as the Vcc is maintained above a threshold, the state of the storage nodes is maintained indefinitely.

In a drive to reduce the transistor count in the SRAM cell, a polysilicon-load-4T cell structure is widely used in some older technologies. This structure is to use two polysilicon resistors of very high resistance to replace the two pull-up PMOS transistors in the aforementioned 6T cell. Here the polysilicon resistor pulls up a storage node via a resistor limited current, in lieu of the switched-on PMOS transistor in the 6T cell. But at the low voltage storage node of a 4T structure, a current continuously flows through the turned-on NMOS transistor and the polysilicon resistor, which results in a higher power consumption and lower access speed.

Accordingly, there is a need for an improved SRAM design with various advantages such as low power consumption and reduced leakages.

SUMMARY

In view of the foregoing, what is disclosed is an improved SRAM device such as a four transistor (4T) SRAM cell and its operating method according to various embodiments of the present invention.

According to one embodiment of the invention, a SRAM cell has a word-line for receiving an activation signal, a first and a second pass-gate transistor with their gate terminals commonly coupled to the word-line, a first and a second parasitic transistors with the first parasitic transistor and the first pass-gate transistor sharing the same source, bulk and drain terminals, and the second parasitic transistor and the second pass-gate transistor sharing same source, bulk and drain terminals, a first and second bit-line with the first bit-line coupled to a first source or drain terminal of the first pass-gate transistor, and the second bit-line coupled to a first source or drain terminal of the second pass-gate transistor, and a first and a second pull-up transistor with their source terminals commonly coupled to a system high voltage (Vcc), wherein, a drain terminal of the first pull-up transistor, a second source or drain terminal of the first pass-gate, a gate terminal of the second pull-up transistor, and a gate terminal of the second parasitic transistor are all coupled together, and wherein, a drain terminal of the second pull-up transistor, a second source or drain terminal of the second pass-gate transistor, a gate terminal of the first pull-up transistor, and a gate terminal of the first parasitic transistor are all coupled together.

The construction and method of operation of the invention, however, together with additional objects and advantages thereof will be best understood from the following description of specific embodiments when read in connection with the accompanying drawings and the claims.

DESCRIPTION

Figure 1:
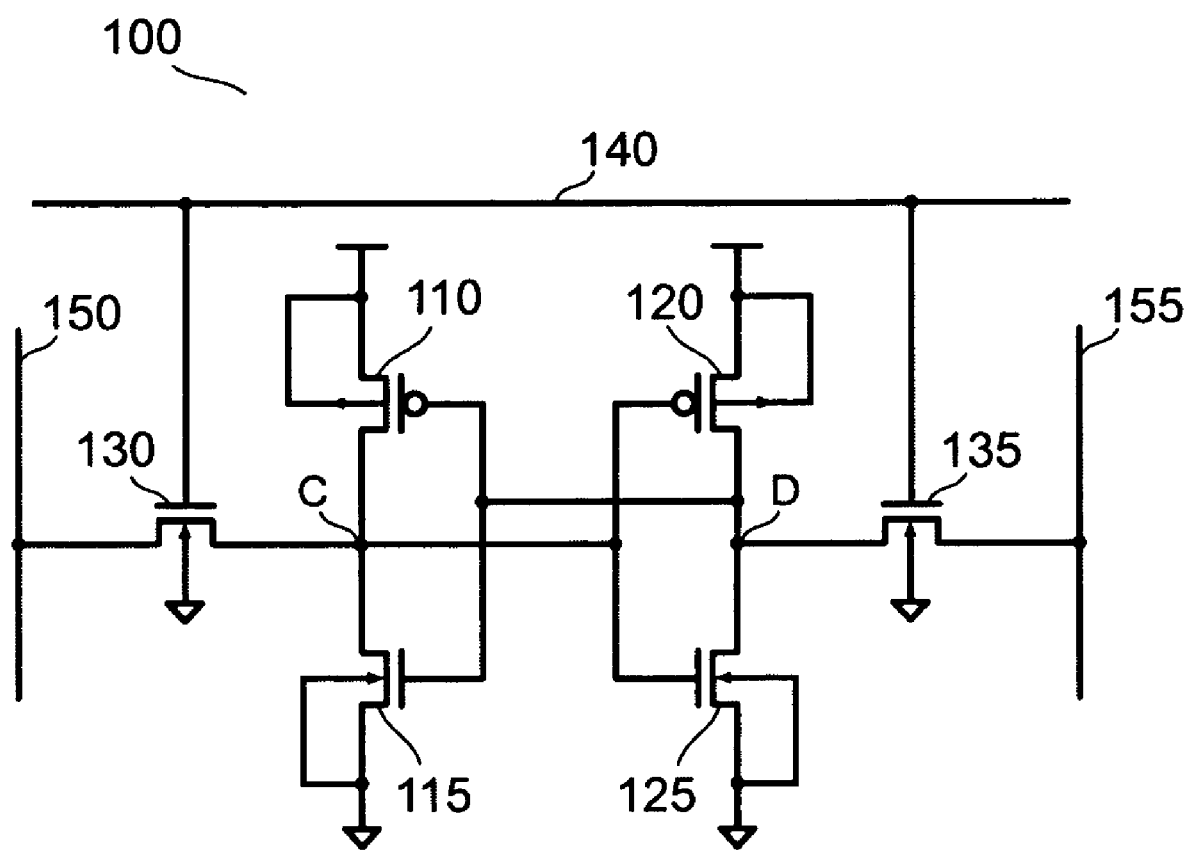
FIG. 1 is a schematic diagram showing a traditional 6T SRAM cell.

FIG. 1 is a schematic diagram illustrating a traditional six transistor (6T) SRAM cell 100. A PMOS pull-up transistor 110 and a NMOS pull-down transistor 115 are connected as a first inverter between a system of high voltage, Vcc, and a system ground, Vss. Another PMOS transistor 120 and NMOS transistor 125 are connected as a second inverter just like the first one. Then the inverters are cross-couple connected. By first coupling the output of the first inverter to the second inverter and second, coupling the input of the first inverter to the output of the second inverter. this forms a latch with bi-stable states to serve as a memory element. Nodes C and D are two storage nodes.

Referring to FIG. 1, when node C is set to the high voltage, the PMOS pull-up transistor 120 is off and the NMOS pull-down transistor 125 is on. Consequently, node D is pulled toward Vss. With node D in low voltage, the NMOS pull-down transistor 115 is off, and the PMOS pull-up transistor 110 is on, which pulls up the node C voltage further higher toward Vcc. The present invention is a positive feed-back circuit and eventually the latch reaches a stable state where node C voltage is Vcc and node D voltage is Vss. Because the circuits for node C and D are mirrored, another state, where node C voltage is Vss and node D voltage is Vcc, is also stable. These bi-stable states can be maintained indefinitely as long as Vcc and Vss are maintained and nodes C and D are isolated from outside circuits.

Two NMOS transistors 130 and 135 serve as pass gates for the storage nodes C and D, respectively. The gate terminals of both NMOS pass-gate transistors 130 and 135 are commonly connected to a word-line 140, which turns on and off the NMOS pass-gate transistor 130 and 135 by switching its voltage to Vcc and Vss, respectively. When the NMOS pass-gate transistors 130 and 135 are on, the voltages of the storage nodes C and D can be read into a pair of bit-lines 150 and 155, or complimentary voltages on the bit-line pairs 150 and 155 can be written into the storage nodes, i.e., bit-line 150 voltage overwrites node C voltage, and bit-line 155 voltage overwrites node D voltage. During non-access operation, both the bit-lines 150 and 155 are held at Vcc.

Figure 2:
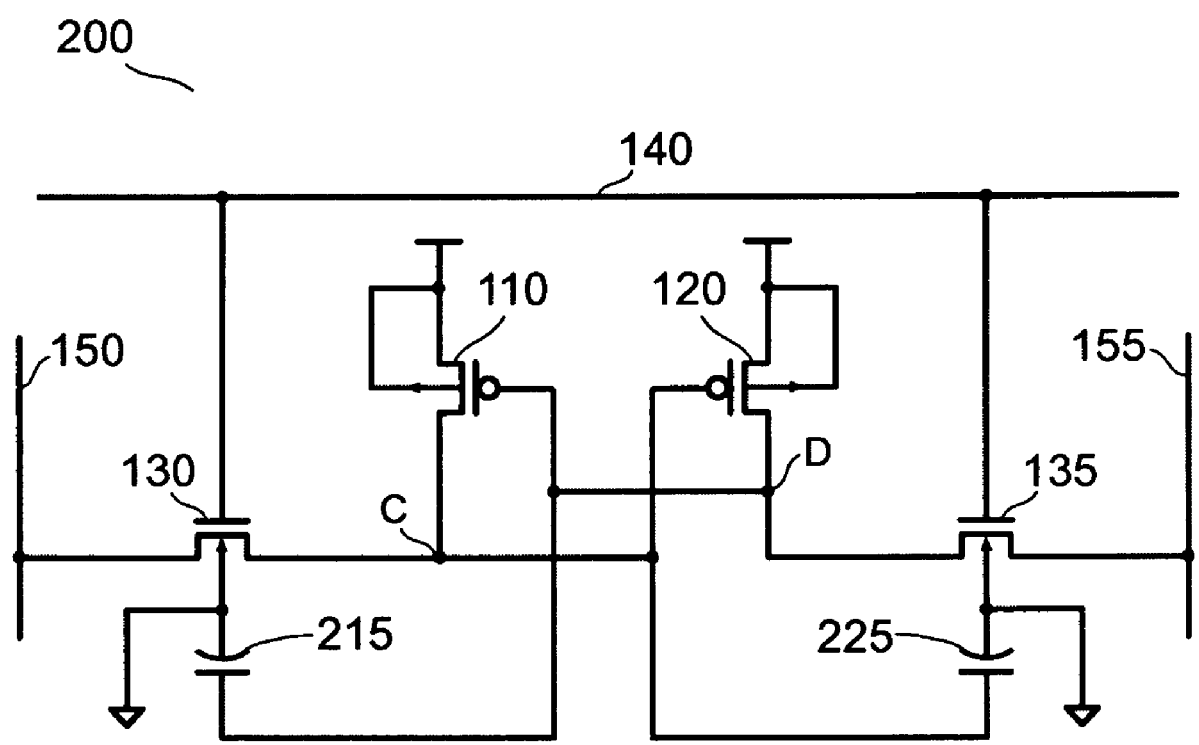
FIG. 2 is a schematic diagram illustrating a 4T SRAM cell according to an embodiment of the present invention.

FIG. 2 is a schematic diagram showing a 4T SRAM cell according to one embodiment of the present invention. There are only four transistors, PMOS pull-up transistors 110 and 120, and NMOS pass-gate transistors 130 and 135, so that the cell size is reduced. Capacitors 215 and 225 are actually parasitic capacitors, the formation of which is better understood in a cross-sectional view of the device in a silicon wafer as shown in FIG. 3.

Figure 3:
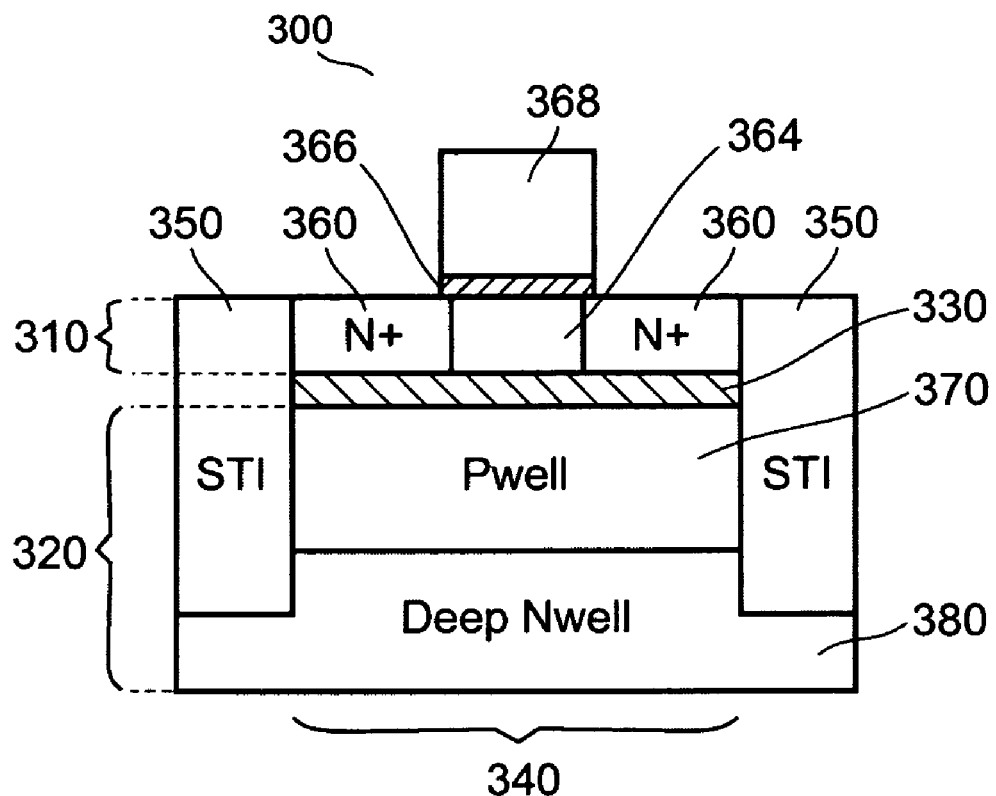
FIG. 3 is a cross sectional view of a NMOS pass-gate transistor according to an embodiment of the present invention.

FIG. 3 shows a cross-section 300 of one of the identical NMOS pass-gate transistors 130 and 135 as shown in FIG. 2. NMOS transistor 130 is used here in the following description. Referring to both FIGS. 2 and 3, the NMOS pass-gate transistor 130 is formed in a thin silicon surface layer 310 that is isolated from an underlying silicon substrate 320 by a buried oxide (BOX) layer 330. Then horizontally, the NMOS transistor 130 active region 340 is isolated by shallow trench isolations (STI) 350, which are formed by etching shallow trenches through the surface layers 310 and 330 and then filling the trenches with oxide. Regions 360 are either source or drain terminals of the NMOS pass-gate transistor 130. Region 364 is the bulk region of the NMOS transistor 130. Regions 366 and 368 are respective gate oxide and polysilicon gate of the NMOS transistor 130. According to the present invention, underneath the device region 340, a Pwell 370 inside a deep Nwell 380 is also formed. When contacts are made to the Pwell 370, the parasitic capacitor 215 is formed with the BOX 330 as a dielectric, and the source or drain 360 and bulk 364 regions of the NMOS 130 as one electrode and the Pwell 370 as the other. Here the source terminal may be defined as a terminal coupled to the lowest voltage for a NMOS transistor and the highest voltage to a PMOS transistor in order to distinguish it from the drain node.

Figure 4:
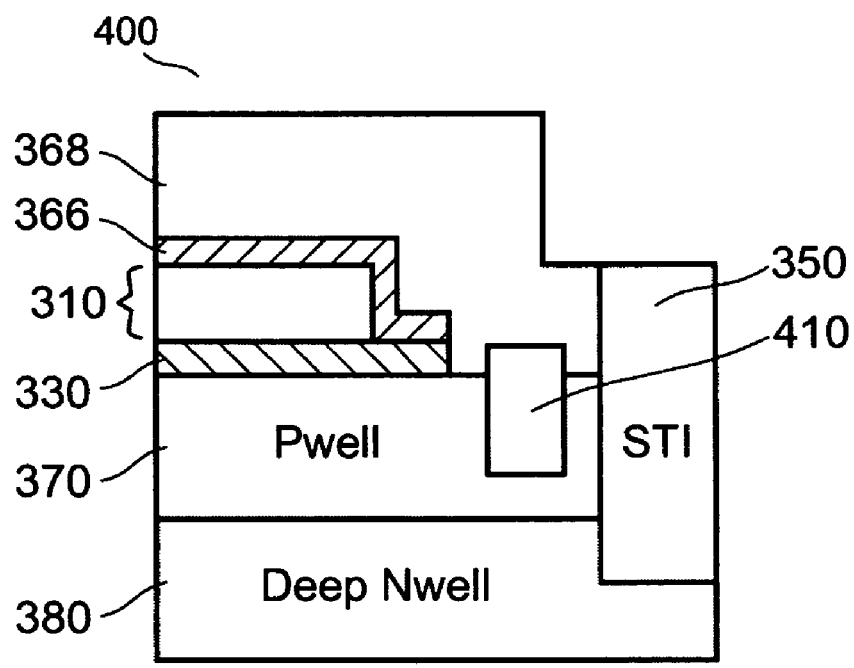
FIG. 4 is a cross sectional view of a Pwell contact according to an embodiment of the present invention.

FIG. 4 is a cross-section 400 of a contact 410 made to the Pwell 370 according to one embodiment of the present invention. Referring to both FIGS. 3 and 4, a hole is etched through the thin silicon surface layer 310 and the BOX 330, then a conductive material, such as tungsten plug, is deposited into the hole to form a contact 410 between the polysilicon gate 368 and Pwell 370. Referring to both FIGS. 2 and 4, if the cross section 400 depicting a part of the parasitic capacitor 225, as the capacitors 215 and 225 are normally made identical, then the contact 410 is the node C.

Figure 5:
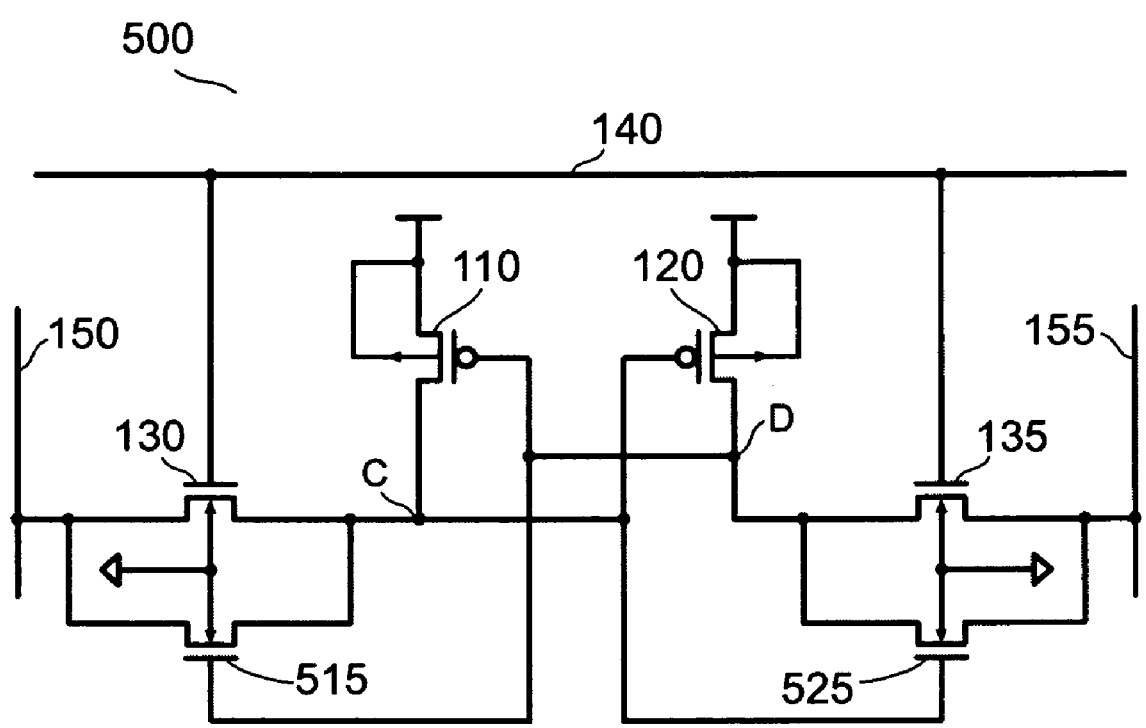
FIG. 5 is a schematic diagram showing a 4T SRAM cell equivalent to the cell shown in FIG. 2.

Taking a closer look at the device structure in FIG. 3, in fact, the parasitic capacitor 215 or 225 (FIG. 2) is equivalent to a parasitic NMOS transistor 515 or 525 as shown in FIG. 5, with the Pwell 370 as a gate, BOX 330 as a gate oxide and regions 360 and 364 serve as source or drain and bulk terminals, respectively. The NMOS transistor 130 and the parasitic NMOS transistor 515 share the same source, drain and bulk regions, and so are the NMOS transistor 135 and the parasitic NMOS transistor 525. However, the parasitic NMOS transistor 515 and NMOS transistor 525 are weak transistors due to their high gate resistance, which comes from the Pwell 370.

A SRAM cell 500 as shown in FIG. 5 is equivalent to the SRAM cell 200 as shown in FIG. 2. The SRAM cell 500 closely resembles the traditional 6T SRAM cell 100 as shown in FIG. 1. Referring to both FIGS. 1 and 5, the PMOS pull-up transistors 110 and 120 as well as the NMOS pass-gate transistors 130 and 135 remain the same. The NMOS pull-down transistors 115 and 125 as shown in FIG. 1 correspond to the NMOS parasitic transistors 515 and 525 as shown in FIG. 5. The connections are the same except that the source terminal of the NMOS pull-down transistor 115 or 125 is coupled to the Vss in FIG. 1, while the source terminal of the NMOS parasitic transistor 515 or 525 is coupled to the corresponding bit-line 150 or 155. According to one embodiment of the present invention, the bit-lines 150 and 155 are kept at Vss during non-access operation to allow the SRAM cell 500 to be operated as a traditional 6T SRAM cell.

Figure 6:
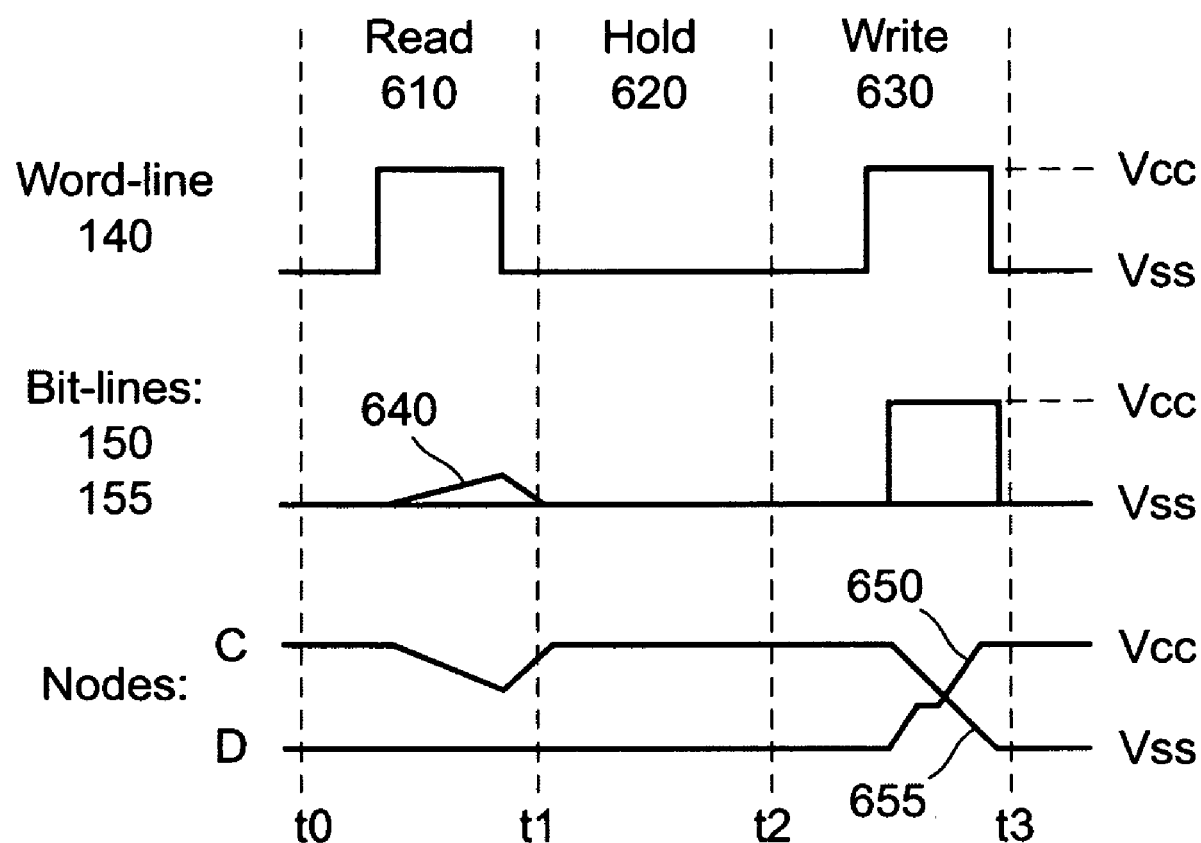
FIG. 6 is a signal waveform diagram illustrating read, non-access and write operations of a 4T SRAM cell according to an embodiment of the present invention.

FIG. 6 is a signal waveform diagram illustrating read, non-access or hold and write operations of the 4T SRAM cell as shown in FIGS. 2 and 5. Time from t0 to t1 is read cycle 610, from t1 to t2 is non-access cycle 620, and from t2 to t3 is write cycle 630. Referring to FIGS. 2, 5 and 6, and during the non-access cycle 620, the word-line 140 stays at Vss, so that the NMOS pass-gate transistors 130 and 135 are turned off. Both bit-lines 150 and 155 are equalized at Vss. Here 'equalized' means that the two bit-lines are operatively coupled to have the same voltage, Vss. As a source or drain terminal of the NMOS parasitic transistor 515 is coupled to the bit-line 150, and a source or drain terminal of the NMOS parasitic transistor 525 is coupled to the bit-line 155, the source or drain terminals of the NMOS parasitic transistors 515 and 525 are grounded to Vss. In such a configuration, the SRAM cell 500 has the same circuit topology as the 6T SRAM cell 100 shown in FIG. 1. The PMOS pull-up transistor 110 and the NMOS parasitic transistor 515 form a first inverter, and the PMOS pull-up transistor 120 and the NMOS parasitic transistor 525 form a mirrored second inverter. Both the first and second inverters are connected to form a latch, with nodes C and D as two complimentary storage nodes storing two stable states. If node C is Vcc, then node D is Vss, and together they represent logic '1'. When node C is Vss and node D is Vcc, logic '0' is considered stored.

Referring to FIGS. 2, 5 and 6, and during the read cycle 610, the word-line 140 rises to Vcc to turn on the NMOS pass-gate transistors 130 and 135, and activate the SRAM cell 500. Assuming prior to read operation, the voltages of the node C and D are Vcc and Vss, respectively. After the word-line 140 is turned high, the voltages that have previously forced the bit-line pairs 150 and 155 to Vss are removed, and cause node C to pull up the bit-line 150 to Vss/Vcc?. The voltage rise 640 of the bit-line 150 is shown in FIG. 6, though the altitude of the maximum rise 640 may not be proportional. At the same time, as the bit-line 155 is coupled to node D which holds a voltage Vss, through the NMOS pass-gate transistor 135, then the bit-line 155 voltage stays low at the Vss. The voltage difference between the bit-lines 150 and 155 will be detected by a sense amplifier (not shown), so that the logic value, 1 or 0, stored in the SRAM cell 500 can be read out.

Referring to FIGS. 2, 5 and 6 during the write cycle 630, the word-line 140 also rises to turn on both the NMOS pass-gate transistors 130 and 135. To activate the SRAM cell 500 is activated. Now the voltages of the bit-lines 150 and 155 are forced to complimentary voltages, either Vcc or Vss, by a write driver (not shown). Assuming the bit-line 150 is forced to Vss and the bit-line 155 is forced to Vcc, and as previously assumed, the voltage of the nodes C and D are Vcc and Vss, respectively, during non-access cycle 620 which is prior to the write cycle 630, then the bit-line 150 will force the node C to flip to Vss, as the write driver is much stronger than the latch of the SRAM cell 500. The voltage fall 650 of the node C is shown in FIG. 6. At the same time, the bit-line 155 forces the node D to rise to Vcc. The voltage rise 655 is also shown in FIG. 6. Then a new state, node C voltage equals to Vss, and node D voltage equals to Vcc, is written into the SRAM cell 500.

Since there are many cells associated with a word-line and many cells associated with a bit-line in a memory array, in order to prevent writing into a wrong cell, the word-line is normally turned on earlier forcing the bit-lines during write operation.

Figure 7:
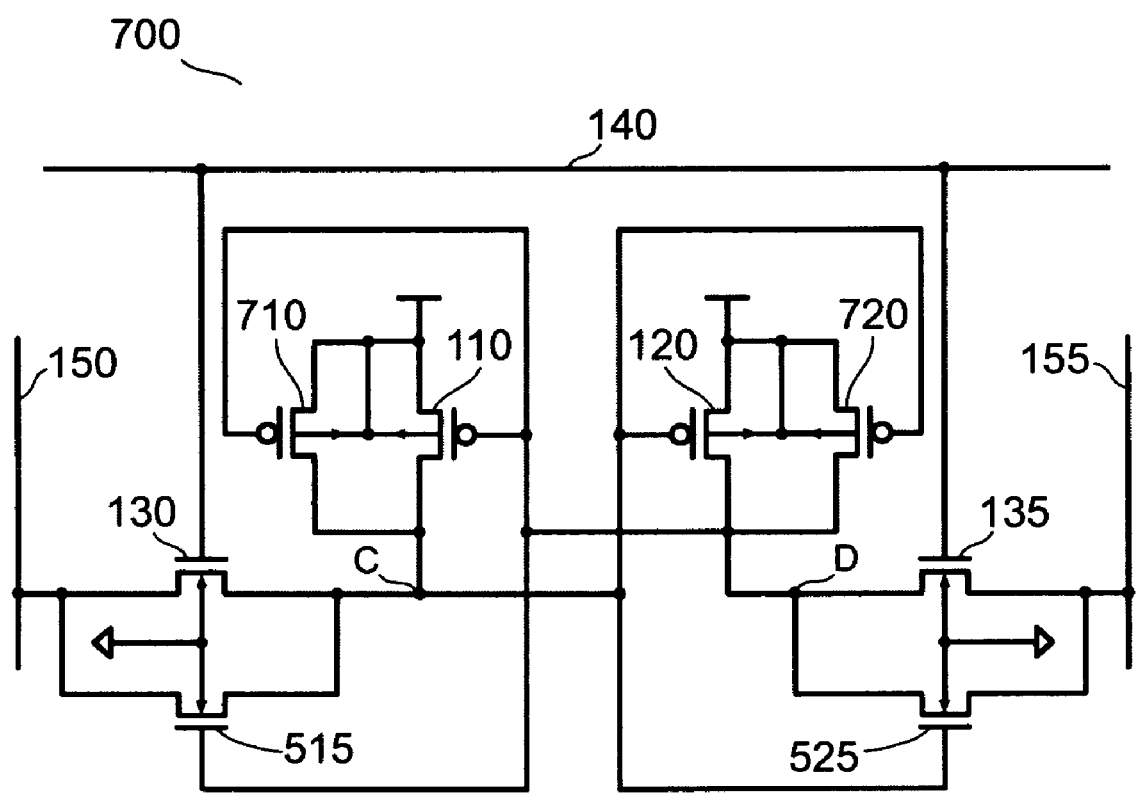
FIG. 7 is a schematic diagram showing an equivalent circuit of an alternative 4T SRAM cell according to another embodiment of the present invention.

FIG. 7 is a schematic diagram showing an alternative 4T SRAM cell 700 according to another embodiment of the present invention. Referring to FIGS. 3, 4, 5 and 7, the PMOS pull-up transistors 110 and 120 are also formed in the thin silicon surface layer 310 that is isolated from an underlying silicon substrate 320 by a buried oxide (BOX) layer 330. Here a Nwell is used inside a deep Pwell or P substrate. The connection between the gate of the PMOS pull-up transistor 110 and to the gate of the NMOS parasitic transistor 515 (corresponding Pwell 370) is extended to the Nwell, which serves as a gate for a PMOS parasitic transistor 710. Similarly, a gate of a PMOS parasitic transistor 720 (Nwell) is connected to the gate of the PMOS pull-up transistor 120 and the gate of the NMOS parasitic transistor 525 (corresponding Pwell 370). The PMOS parasitic transistors 710 and 720 are connected exactly parallel to the PMOS pull-up transistors 110 and 120, respectively, and only strengthens their corresponding PMOS pull-up transistors. This allows the SRAM cell 700 to function exactly the same as the SRAM cell 500.

The present invention provides various advantages over the prior art including a smaller device area. The well accepted Silicon On Insulator processing technologies can be used to develop the SRAM devices.

This invention provides many different embodiments for implementing different features of the present invention. Specific examples of components and methods are described to help clarify the disclosure. These are, of course, merely examples and are not intended to limit the disclosure from that described in the claims.

What is claimed is:

1. A static random access memory (SRAM) cell, the SRAM cell comprising:
   a word-line for receiving an activation signal;
   a first and a second pass-gate transistors with their gate terminals commonly coupled to the word-line;
   a first and a second parasitic transistor with the first parasitic transistor and the first pass-gate transistor sharing the same source, bulk and drain terminals, and the second parasitic transistor and the second pass-gate transistor sharing the same source, bulk and drain terminals;
   a first and second bit-line with the first bit-line coupled to a first source or drain terminal of the first pass-gate transistor, and the second bit-line coupled to a first source or drain terminal of the second pass-gate transistor; and
   a first and a second pull-up transistor with their source terminals commonly coupled to a high voltage system (Vcc),
   wherein, a drain terminal of the first pull-up transistor, a second source or drain terminal of the first pass-gate, a gate terminal of the second pull-up transistor, and a gate terminal of the second parasitic transistor are all coupled together, and
   wherein, a drain terminal of the second pull-up transistor, a second source or drain terminal of the second pass-gate transistor, a gate terminal of the first pull-up transistor, and a gate terminal of the first parasitic transistor are all coupled together.

2. The SRAM cell of claim 1, wherein the first and second pass-gate transistors are formed in a silicon layer on top of a buried insulation layer.

3. The SRAM cell of claim 2, wherein the coupling between the gate terminal of the first pull-up transistor and the gate terminal of the first parasitic transistor is formed by making one or more contacts between the gate terminal of the first pull-up transistor and a first predetermined well region under the buried insulation layer, wherein the first predetermined well region is the gate terminal of the first parasitic transistor, and
   wherein the coupling between the gate terminal of the second pull-up transistor and the gate terminal of the second parasitic transistor is formed by making one or more contacts between the gate terminal of the second pull-up transistor and a second predetermined well region under the buried insulation layer, wherein the second predetermined well region is the gate terminal of the second parasitic transistor.

4. The SRAM cell of claim 3, wherein the first and second predetermined well regions are Pwells inside a Deep Nwell.

5. The SRAM cell of claim 3, wherein the first and second predetermined well regions are Pwells inside an N substrate.

6. The SRAM cell of claim 3, wherein the first and second predetermined well regions have corresponding trench isolations for isolating the same.

7. The SRAM cell of claim 1, wherein the first and second pass-gate transistors have corresponding trench isolations for isolating the same.

8. The SRAM cell of claim 1, wherein the first and second pull-up transistors have corresponding trench isolations for isolating the same.

9. The SRAM cell of claim 1, further comprises a third and fourth parasitic transistors with the third parasitic transistor sharing the same source, bulk and drain terminals with the first pull-up transistor, and the fourth parasitic transistor sharing the same source, bulk and drain terminals with the second pull-up transistor, and gate terminals of the third parasitic transistor and the first pull-up transistor are coupled together, and gate terminals of the fourth parasitic transistor and the second pull-up transistor are also coupled together.

10. The SRAM cell of claim 9, wherein the first and second pull-up transistors are formed in a silicon layer on top of a buried insulation layer.

11. The SRAM cell of claim 10, wherein the connection between the gates of the third parasitic transistor and the first pull-up transistor is formed by making one or more contacts between the gate of the first pull-up transistor and a third predetermined well region under the buried oxide layer, wherein the third predetermined well region is the gate of the third parasitic transistor, and
   wherein, the connection between the gate terminals of the fourth parasitic transistor and the second pull-up transistor is formed by making one or more contacts between the gate terminal of the second pull-up transistor and a fourth predetermined well region under the buried insulation layer, wherein the fourth predetermined well region is the gate terminal of the fourth parasitic transistor.

12. The SRAM cell of claim 11, wherein the third and fourth predetermined well regions are Nwells inside a Deep Pwell.

13. The SRAM cell of claim 11, wherein the third and fourth predetermined well regions are Nwells inside a P substrate.

14. The SRAM cell of claim 11, wherein the third and fourth predetermined well regions have trench isolations.

15. A method for operating a static random access memory (SRAM) that has a word-line and a pair of bit-lines, the method comprising:
 holding voltages of the pair of bit-lines to a system low voltage (Vss) during non-access cycles; and
 holding a word-line voltage to the Vss during the non-access cycles.

16. The method of claim 15, further comprising raising the word-line voltage to a system high voltage (Vcc) during read and write cycles.

17. The method of claim 16, further comprising forcing a predetermined one of the pair of bit-lines to Vcc while forcing the other bit-line with Vss during the write cycles.

18. The method of claim 17, further comprising synchronizing the raising of the word-line voltage and the forcing of the bit-line voltage during the write cycle.

19. The method of claim 18, wherein the synchronizing further comprises raising the word-line voltage prior to forcing the bit-line voltage.

20. The method of claim 16, further comprising removing the voltages held from the pair of bit-lines during the read cycles.

21. The method of claim 20, further comprises synchronizing the raising of the word-line voltage and the removing of the bit-line voltage during the read cycles.

22. The method of claim 21, wherein the synchronizing further comprises raising the word-line voltage prior to removing the bit-line holding voltage.

23. A method for operating a static random access memory (SRAM) that has a word-line and a pair of bit-lines, the method comprising:
 holding voltages of the pair of bit-lines and the word-line to a system low voltage (Vss) during non-access cycles;
 raising a word-line voltage to a system high voltage (Vcc) during read and write cycles;
 removing the voltages held from the pair of bit-lines during read cycles; and
 forcing a predetermined pair of bit-lines with Vcc while forcing the other bit-line with Vss during write cycles.

24. The method of claim 23, further comprising synchronizing the raising of the word-line voltage and the removing of the bit-line voltage during the read cycles.

25. The method of claim 24, wherein the synchronizing further comprises raising the word-line voltage prior to removing the bit-line voltage.

26. The method of claim 23 further comprising synchronizing the raising of the word-line voltage and the forcing of the bit-line voltage during the write cycles.

27. The method of claim 26, wherein the synchronizing further comprises raising the word-line voltage prior to forcing the bit-line voltage.

* * * * *